United States Patent
Wang et al.

(10) Patent No.: US 6,528,417 B1
(45) Date of Patent: Mar. 4, 2003

(54) METAL PATTERNED STRUCTURE FOR SIN SURFACE ADHESION ENHANCEMENT

(75) Inventors: Chung-Yu Wang, Jung he (TW); Chender Huang, Hsin-Chu (TW); Pei-Haw Tsao, Taichung (TW); Ken Chen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 2 days.

(21) Appl. No.: 09/953,613

(22) Filed: Sep. 17, 2001

(51) Int. Cl.⁷ .............................................. H01L 21/44
(52) U.S. Cl. ...................... 438/665; 438/666; 438/614; 438/108; 438/926
(58) Field of Search ................................ 438/108, 118, 438/614, 665, 666, 926

(56) References Cited

U.S. PATENT DOCUMENTS

| | | | | |
|---|---|---|---|---|
| 151,228 A | * | 5/1874 | Kweon et al. ............... | 600/224 |
| 5,441,915 A | * | 8/1995 | Lee ............................ | 438/631 |
| 5,539,153 A | | 7/1996 | Schwiebert et al. ........ | 174/260 |
| 5,656,858 A | | 8/1997 | Kondo et al. ............... | 257/737 |
| 5,880,017 A | | 3/1999 | Schwiebert et al. ........ | 438/613 |
| 5,892,270 A | | 4/1999 | Pan ............................ | 257/666 |
| 6,096,649 A | * | 8/2000 | Jang ............................ | 438/687 |
| 6,153,940 A | | 11/2000 | Zakel et al. ................. | 257/779 |
| 6,242,815 B1 | * | 6/2001 | Hsu et al. ................... | 257/786 |

FOREIGN PATENT DOCUMENTS

EP            0814510 A2  * 12/1997

* cited by examiner

Primary Examiner—Trung Dang
(74) Attorney, Agent, or Firm—George O. Saile; Stephen B. Ackerman; Stephen G. Stanton

(57) ABSTRACT

A method of improving adhesion of a surface including the following steps. A structure having an upper surface is provided. A composite anchor layer is formed over the upper surface of the structure. The composite anchor layer including at least an upper anchor sub-layer and a lower anchor sub-layer. The upper anchor sub-layer is patterned to form a dense pattern of upper sub-anchors. The lower anchor sub-layer is then patterned using the upper sub-anchors as masks to form lower sub-anchors. The respective upper sub-anchors and lower sub-anchors form a dense pattern of anchors whereby the dense pattern of anchors over the upper surface improve the adhesion of the surface.

36 Claims, 3 Drawing Sheets

METAL PATTERNED STRUCTURE FOR SIN SURFACE ADHESION ENHANCEMENT

FIELD OF THE INVENTION

The present invention relates generally to semiconductor fabrication and more specifically to adhesion issues in flip-chip package fabrication.

BACKGROUND OF THE INVENTION

In flip-chip package fabrication, the adhesion strength between the underfill and the passivation layer, generally comprised of silicon nitride ($Si_xN_y$ or just SiN), benzocyclobutene (BCB) or polyimide (PI), is one key factor to pass extreme reliability test conditions. Once the underfill material is set and without any surface treatment of the surface of SiN passivation layers, the flip-chip package with cured underfill material is hard pressed to pass extreme reliability tests due to poor adhesion between the underfill and the smooth SiN surface of the passivation layer as nothing exists to anchor the underfill to the SiN passivation layer. Failures occur due to moisture penetration in extreme stress conditions such as in a pressure cooker (PCT) test. Such failures are particularly a problem where an $Si_xN_y$ passivation layer is formed over the integrated circuit (IC) surface.

Some attempts have been made to increase the adhesion such as designing different underfill materials or applying surface treatments onto the passivation layer such as physical roughening or, for BCB or PI passivation layers, organic plasma surface treatments.

U.S. Pat. Nos. 5,880,017 and 5,539,153 each to Schwiebert et al. each describe a method of bumping substrates by contained paste deposition.

U.S. Pat. No. 5,656,858 to Kondo et al. describes a semiconductor device having a high adhesiveness to the copper film and the barrier metal at the bump part or LSI wiring part of a flip-chip.

U.S. Pat. No. 5,892,270 to Pan describes an apparatus and method of attaching input/output (I/O) pads of an IC die to package leads.

U.S. Pat. No. 6,153,940 to Zakel et al. describes a solder bump, and a method of making same, of an inhomogeneous material composition for connecting contact pad metallization of different electronic components or substrates in flip-chip technology.

SUMMARY OF THE INVENTION

Accordingly, it is an object of an embodiment of the present invention to provide an improved method of increasing adhesion of underfill materials to a surface.

Another object of an embodiment of the present invention is to provide an method of non-plasma treatment roughening of a surface to increase the roughened surface adhesion to overlying materials.

Other objects will appear hereinafter.

It has now been discovered that the above and other objects of the present invention may be accomplished in the following manner. Specifically, a composite anchor layer is formed over the upper surface of the structure. The composite anchor layer including at least an upper anchor sub-layer and a lower anchor sub-layer. The upper anchor sub-layer is patterned to form a dense pattern of upper sub-anchors. The lower anchor sub-layer is then patterned using the upper sub-anchors as masks to form lower sub-anchors. The respective upper sub-anchors and lower sub-anchors form a dense pattern of anchors whereby the dense pattern of anchors over the upper surface improve the adhesion of the surface.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
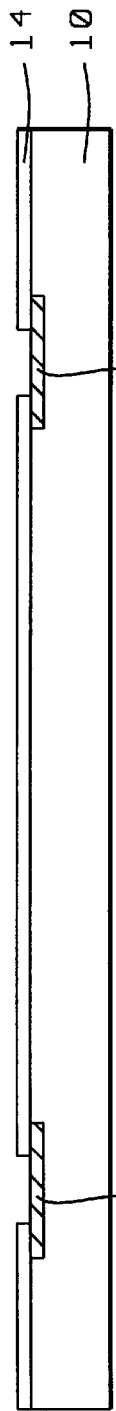
FIGS. 1 to 7 schematically illustrate a preferred embodiment of the present invention.

As shown in FIG. 1, structure 10 includes one or more conducting structures 12 exposed through patterned passivation layer 14. Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Conducting structures 12 may be input/output (I/O) pads and are electrically connected to active and passive devices (not shown) formed within structure 10 and passivation layer 14 may be comprised of SiN, for example. Passivation layer 14 is comprised of non-organic and non-polyimide materials.

Under Bump Metallurgy (UBM) Sputter

Figure 2:
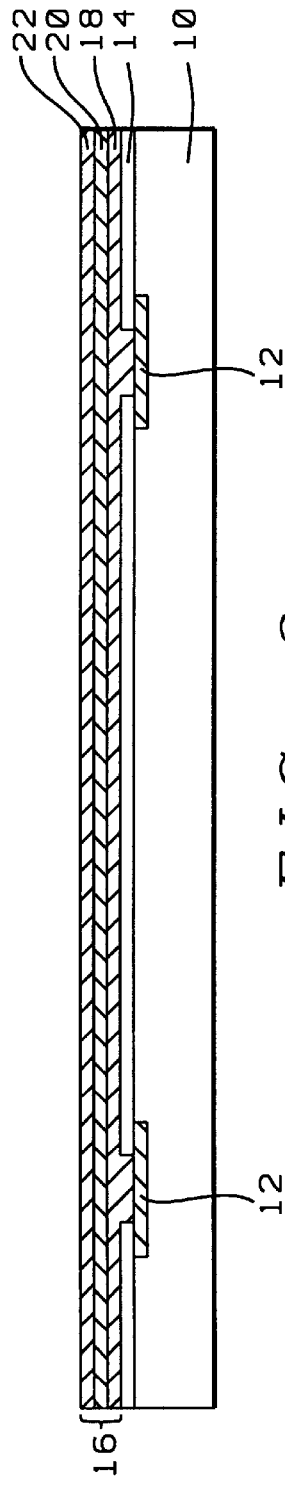

As shown in FIG. 2, an under bump metallurgy (UBM) sputter is performed to form UBM composite layer 16 preferably comprising three separate layers: upper UBM layer 22, middle UBM layer 20 and lower UBM layer 18. Upper/middle/lower UBM layers 22, 20, 18 are preferably comprised of: copper (Cu)/chromium copper (CrCu)/chromium (Cr), respectively; Cu/nickel vanadium (NiV)/aluminum (Al), respectively; or Cu/NiV/titanium (Ti); and are more preferably comprised of Cu/CrCu/Cr, respectively.

It is noted that UBM composite layer 16 may comprise only an upper layer UBM layer and a lower UBM layer. In this case, the upper layer UBM layer is preferably comprised of Cu and the lower UBM layer is comprised of titanium tungsten (TiW).

Masking of Composite UBM Layer 16

Figure 3:
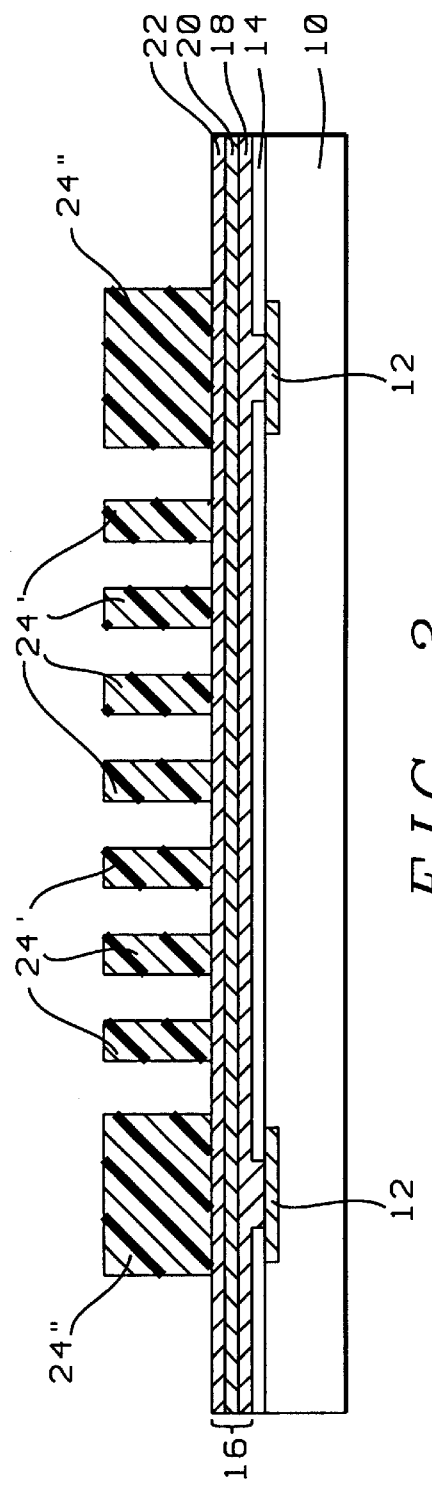

In a key step of the invention and as shown in FIG. 3, a patterned masking layer 24 is formed over the composite UBM layer 16 whereby patterned masking portions 24' over composite UBM layer 16 extend between the patterned masking portions 24" over composite UBM layer 16 over I/O pads 12. Masking portions 24' will be used to form a dense dummy pattern of composite UBM layer dummy portions 40 between UBM layer I/O portions 30 over I/O pads 12 as will be described hereafter. This dense dummy pattern 50 achieves a surface roughness over passivation layer 14 which assists in better adhesion of the under or gap fill to the integrated circuit (IC) chip.

Patterned masking layer 24 is preferably comprised of positive photoresist.

Etching of Upper UBM Layer 22 of UBM Composite Layer 16

Figure 4:
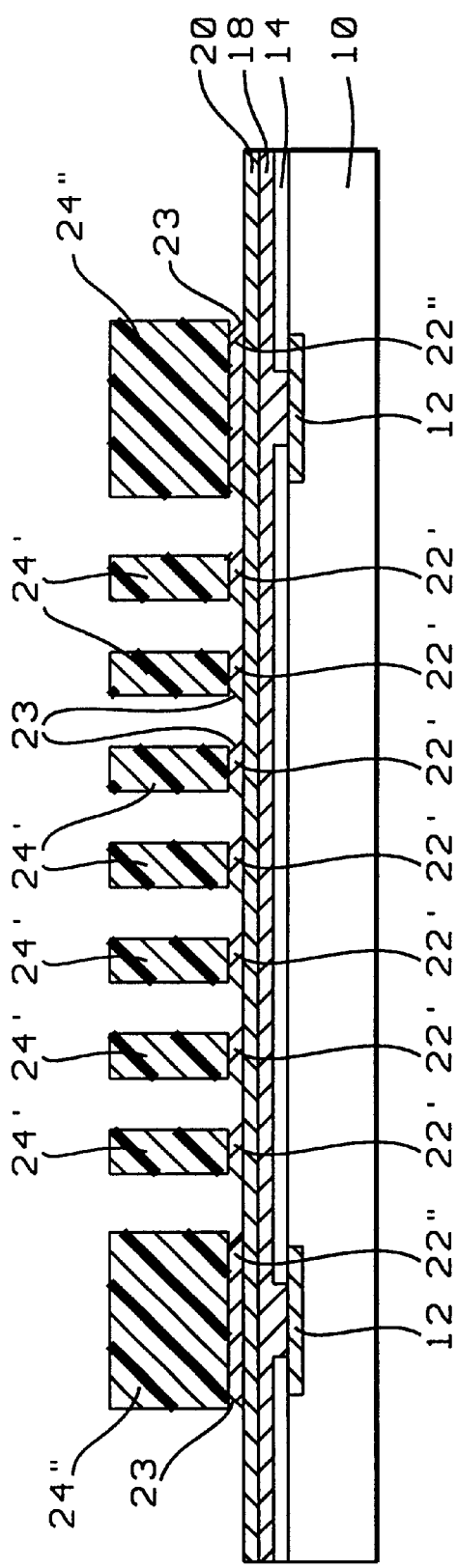

As shown in FIG. 4, upper UBM layer 22 of UBM composite layer 16 is etched using patterned masking layer 24 as a mask leaving larger upper UBM layer I/O portions 22" over I/O pads 12 and smaller upper UBM layer dummy portions 22' between them as part of the composite UBM layer dummy portions 40 of the dense dummy pattern 50. The minimum spacing between the anchors of the dense dummy pattern 50 is preferably from about 1 to 4 μm while the maximum spacing between the anchors of the dense dummy pattern 50 is preferably from about 10 to 15 μm. The anchors of the dense dummy pattern 50 are preferably spaced apart from about 1 to 15 μm, more preferably from about 2 to 10 μm and most preferably from about 2 to 4 μm.

Due to the nature of the etching process of upper UBM layer 22, the sidewalls 23 of both the upper UBM layer I/O portions 22" and the upper UBM layer dummy portions 22' between them slope inwardly under the patterned masking portions 24', 24", respectively, as shown in FIG. 4.

Removal of Patterned Masking Layer 24

Figure 5:
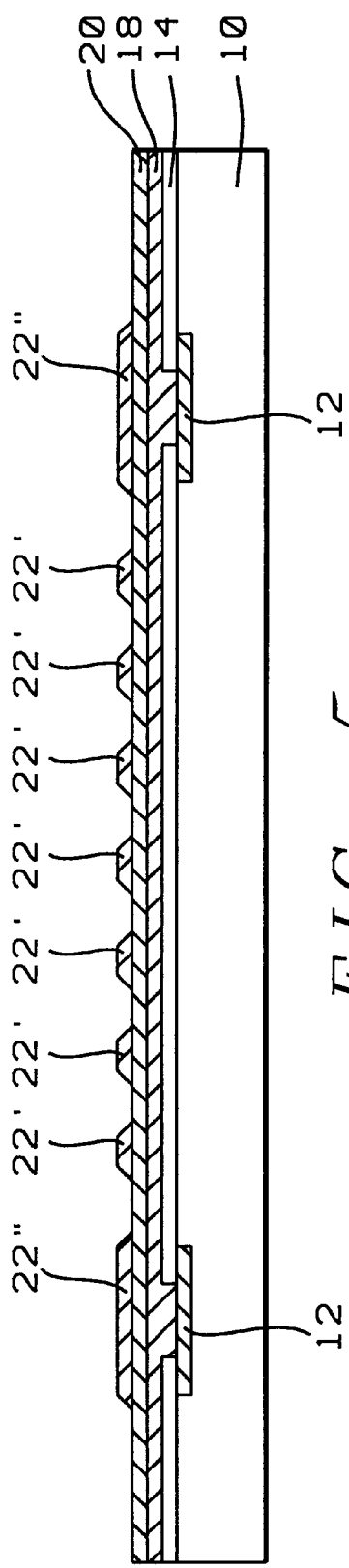

As shown in FIG. 5, patterned masking layer is removed from the structure, exposing the upper UBM layer I/O portions 22" and the upper UBM layer dummy portions 22' between them.

Etching of Middle and Lower UBM layers 20,18

Figure 6:
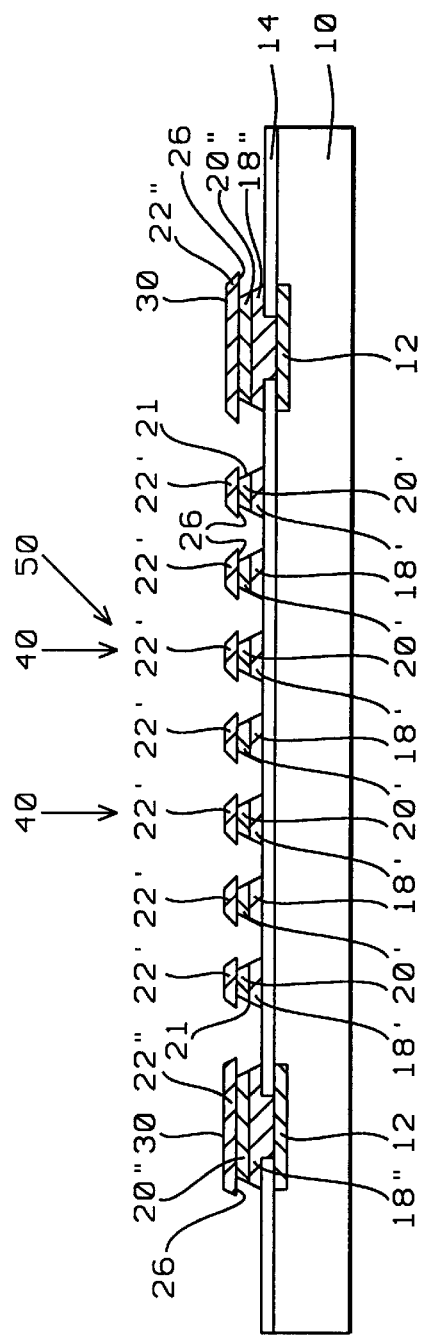

As shown in FIG. 6, middle and lower UBM layers 20, 18, respectively, of UBM composite layer 16 are etched using the upper UBM layer I/O portions 22" and the upper UBM layer dummy portions 22' to form middle and lower UBM layer I/O portions 20", 18", respectively, and middle and lower UBM layer dummy portions 20', 18', respectively. Dense and fine dummy pattern 50 is completed and comprises upper, middle and lower UBM layer dummy portions 22', 20', 18', respectively. The middle UBM layer 20 and the lower UBM layer 18 may be either etched sequentially or simultaneously depending upon the etchant(s) used. The focus of the present invention is a two step UMB composite layer 16 that either:

(1) etches upper and middle UBM layers 22, 20 and then lower UBM layer 18 in which case the etch is preferably selective to the upper and middle UBM layers 22, 20 with respect to the lower UBM layer 18 which is preferred; or (2) upper UBM layer 22 and then the middle and lower UBM layers 20, 18 in which case the etch is more preferably selective to the middle and lower UBM layers 20, 18 with respect to the etched upper UBM layer portions 22', 22" which is more preferred and is specifically described below and shown in the Figures.

Due to the nature of the etching process of middle and lower UBM layers 20, 18, the common sidewalls 21 of both the middle and lower UBM layer I/O portions 20", 18", respectively, and middle and lower UBM layer dummy portions 20', 18', respectively, slope inwardly under the upper UBM layer I/O portions 22" and the upper UBM layer dummy portions 22', respectively, as shown in FIG. 6. This sloping of the common sidewalls 21 under the upper UBM layer I/O portions 22" and the upper UBM layer dummy portions 22' form undercuts 26 which will serve to further assist in better adhesion of the under or gap fill to the integrated circuit (IC) chip.

Formation of Bumps 32 and Application of Under or Gap Fill 28

Figure 7:
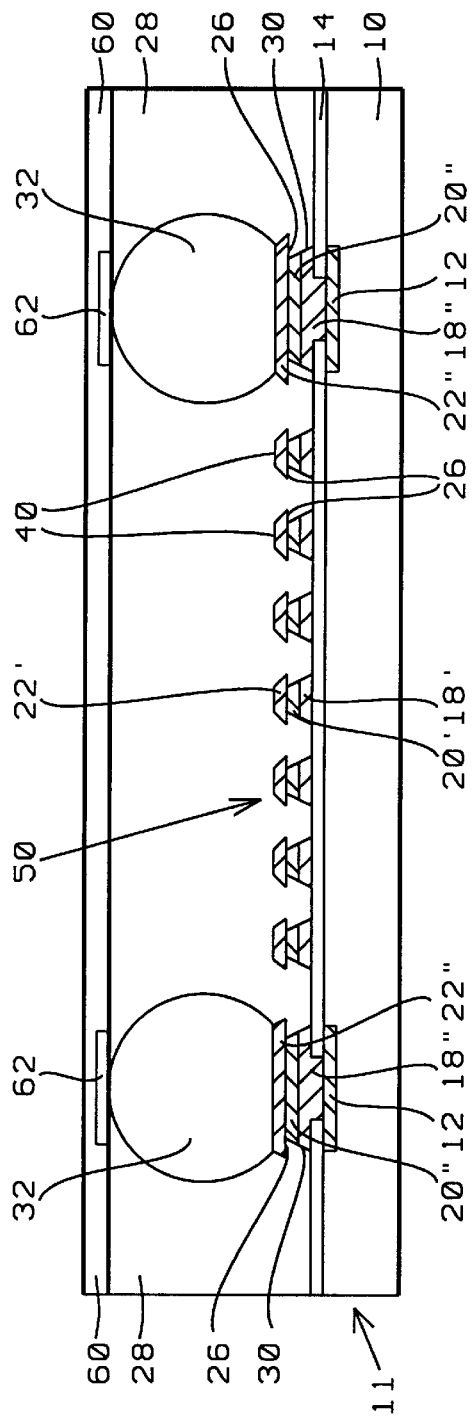

As shown in FIG. 7, bumps 32 are formed over upper UBM layer I/O portions 22" over I/O pads 12 and essentially completes formation of chip 11.

Although not shown inverted in FIG. 7, the chip 11 is inverted (flip-chip) and attached to a substrate 60, such as a bumping tape (B.T.) 60, such that bumps 32 are electrically connected to exposed electrically conductive structures 62 on substrate 60. Under or gap fill 28 is applied into the gaps between the chip 11 and the B.T. substrate 60 to ensure the chip 11 and B.T. substrate 60 adhere via the under or gap fill 28. Once the under or gap fill 28 cures, a good anchor effect is achieved and improved adhesion is achieved between the under or gap fill 28 and the passivation layer 14 due to the macro and micro adhesion enhancement.

The dense and fine dummy pattern 50 greatly improves the macro physical adhesion of the chip 11 to the under or gap fill 28 compared to the prior art smooth SiN passivation layer 14 surface. Further, undercuts 28, formed by the two-step UBM 16 etching process, further improves the micro physical adhesion of the chip 11 to the under or gap fill 28.

Advantages of the Present Invention

The advantages of the present invention include:

1. improved adhesion between the passivation layer and the under or gap fill;
2. no additional photomask is needed; and
3. there is thermal dissipation enhancement.

While particular embodiments of the present invention have been illustrated and described, it is not intended to limit the invention, except as defined by the following claims.

We claim:

1. A method of improving adhesion of a surface, including the steps of:

providing a structure having an upper surface;

forming a composite anchor layer over the upper surface of the structure; the composite anchor layer including at least an upper anchor sub-layer and a lower anchor sub-layer;

patterning the upper anchor sub-layer to form a dense pattern of upper sub-anchors; and patterning the lower anchor sub-layer using the upper sub-anchors as masks to form lower sub-anchors; the respective upper sub-anchors and lower sub-anchors forming a dense pattern of anchors whereby the dense pattern of anchors over the upper surface improve the adhesion of the surface.

2. The method of claim 1, wherein each lower sub-anchor has sloping sidewalls to form undercuts between the lower sub-anchors and the upper sub-anchors; whereby the undercuts further improve the adhesion of the surface.

3. The method of claim 1, wherein the structure is a semiconductor wafer or substrate, the upper anchor sub-layer is copper; the lower anchor sub-layer is a dual layer comprising a first metal layer over a second metal layer wherein the first metal layer is a metal selected from the group consisting of: CrCu and NiV and; and the second metal layer is a metal selected from the group consisting of: Cr; Al and Ti.

4. The method of claim 1, wherein the upper anchor sub-layer is copper; the lower anchor sub-layer is a dual layer comprising a first metal layer over a second metal layer wherein the first metal layer is a metal selected from the group consisting of: CrCu; and NiV; and the second metal layer is a metal selected from the group consisting of: Cr and Al.

5. The method of claim 1, wherein the upper anchor sub-layer is copper; the lower anchor sub-layer is a dual layer comprising a first metal layer over a second metal layer wherein the first metal layer is CrCu; and the second metal layer is Cr.

6. The method of claim 1, wherein the upper anchor sub-layer is patterning using an overlying material comprised of patterned positive photoresist.

7. The method of claim 1, wherein the anchors are separated by from about 1 to 15 μm.

8. The method of claim 1, wherein the anchors are separated by from about 2 to 10 μm.

9. The method of claim 1, wherein the anchors are separated by from about 2 to 4 μm.

10. The method of claim 1, wherein the anchors are formed simultaneously with formation of UBM layers.

11. The method of claim 1, wherein underfill or gap fill material is applied over the surface and the anchors whereby the anchors improve the adhesion of surface to the underfill or gap fill material.

12. The method of claim 1, wherein the structure has a non-organic material upper surface and the composite anchor layer is comprised of metal.

13. The method of claim 1, wherein the structure has a SiN upper surface and the composite anchor layer is comprised of metal.

14. A method of improving adhesion of a surface, including the steps of:

providing a structure having an upper surface;

forming a composite anchor layer over the upper surface of the structure; the composite anchor layer including at least an upper anchor sub-layer and a lower anchor sub-layer; wherein each lower sub-anchor has sloping sidewalls to form undercuts 26 between the lower sub-anchors and the upper sub-anchors; whereby the undercuts further improve the adhesion of the surface;

patterning the upper anchor sub-layer to form a dense pattern of upper sub-anchors; and patterning the lower anchor sub-layer using the upper sub-anchors as masks to form lower sub-anchors; the respective upper sub-anchors and lower sub-anchors forming a dense pattern of anchors whereby the dense pattern of anchors over the upper surface improve the adhesion of the surface.

15. The method of claim 14, wherein the structure is a semiconductor wafer or substrate, the upper anchor sub-layer is copper; the lower anchor sub-layer is a dual layer comprising a first metal layer over a second metal layer wherein the first metal layer is a metal selected from the group consisting of: CrCu and NiV and; and the second metal layer is a metal selected from the group consisting of: Cr; Al and Ti.

16. The method of claim 14, wherein the upper anchor sub-layer is copper; the lower anchor sub-layer is a dual layer comprising a first metal layer over a second metal layer wherein the first metal layer is a metal selected from the group consisting of: CrCu; and NiV; and the second metal layer is a metal selected from the group consisting of: Cr and Al.

17. The method of claim 14, wherein the upper anchor sub-layer is copper; the lower anchor sub-layer is a dual layer comprising a first metal layer over a second metal layer wherein the first metal layer is CrCu; and the second metal layer is Cr.

18. The method of claim 14, wherein the upper anchor sub-layer is patterning using an overlying material comprised of patterned positive photoresist.

19. The method of claim 14, wherein the anchors are separated by from about 1 to 15 μm.

20. The method of claim 14, wherein the anchors are separated by from about 2 to 10 μm.

21. The method of claim 14, wherein the anchors are separated by from about 2 to 4 μm.

22. The method of claim 14, wherein the anchors are formed simultaneously with formation of UBM layers.

23. The method of claim 14, wherein underfill or gap fill material is applied over the surface and the anchors whereby the anchors improve the adhesion of surface to the underfill or gap fill material.

24. The method of claim 14, wherein the structure has a non-organic material upper surface and the composite anchor layer is comprised of metal.

25. The method of claim 14, wherein the structure has a SiN upper surface and the composite anchor layer is comprised of metal.

26. A method of improving adhesion of a surface, including the steps of:

providing a structure having an upper non-organic surface;

forming a composite metal anchor layer over the upper non-organic surface of the structure; the composite metal anchor layer including at least an upper metal anchor sub-layer and a lower metal anchor sub-layer; wherein each lower metal sub-anchor has sloping sidewalls to form undercuts between the lower metal sub-anchors and the upper metal sub-anchors; whereby the undercuts further improve the adhesion of the surface;

patterning the upper metal anchor sub-layer to form a dense pattern of upper metal sub-anchors; and patterning the lower metal anchor sub-layer using the upper metal sub-anchors as masks to form lower sub-anchors; the respective upper metal sub-anchors and lower metal sub-anchors forming a dense pattern of metal anchors whereby the dense pattern of metal anchors over the upper surface improve the adhesion of the surface.

27. The method of claim 26, wherein the structure is a semiconductor wafer or substrate, the upper metal anchor sub-layer is copper; the lower metal anchor sub-layer is a dual layer comprising a first metal layer over a second metal layer wherein the first metal layer is a metal selected from the group consisting of: CrCu and NiV and; and the second metal layer is a metal selected from the group consisting of: Cr; Al and Ti.

28. The method of claim 26, wherein the upper metal anchor sub-layer is copper; the lower metal anchor sub-layer is a dual layer comprising a first metal layer over a second metal layer wherein the first metal layer is a metal selected from the group consisting of: CrCu; and NiV; and the second metal layer is a metal selected from the group consisting of: Cr and Al.

29. The method of claim 26, wherein the upper metal anchor sub-layer is copper; the lower metal anchor sub-layer is a dual layer comprising a first metal layer over a second metal layer wherein the first metal layer is CrCu; and the second metal layer is Cr.

30. The method of claim 26, wherein the upper metal anchor sub-layer is patterning using an overlying material comprised of patterned positive photoresist.

31. The method of claim 26, wherein the metal anchors are separated by from about 1 to 15 μm.

32. The method of claim 26, wherein the metal anchors are separated by from about 2 to 10 μm.

33. The method of claim 26, wherein the metal anchors are separated by from about 2 to 4 μm.

34. The method of claim 26, wherein the metal anchors are formed simultaneously with formation of UBM layers.

35. The method of claim 26, wherein underfill or gap fill material is applied over the surface and the metal anchors whereby the metal anchors improve the adhesion of surface to the underfill or gap fill material.

36. The method of claim 26, wherein the structure has a SiN upper surface.

* * * * *